United States Patent
Kim

(10) Patent No.: US 10,270,059 B2
(45) Date of Patent: Apr. 23, 2019

(54) FLEXIBLE DISPLAY HAVING GROOVED INSULATING LAYER AND MANUFACTURING METHOD THEREOF

(71) Applicant: Samsung Display Co., Ltd., Yongin-si, Gyeonggi-do (KR)

(72) Inventor: Nam Jin Kim, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 240 days.

(21) Appl. No.: 15/240,820

(22) Filed: Aug. 18, 2016

(65) Prior Publication Data
US 2017/0062760 A1 Mar. 2, 2017

(30) Foreign Application Priority Data
Aug. 24, 2015 (KR) .......................... 10-2015-0118837

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 27/3276* (2013.01); *H01L 51/0097* (2013.01); *H01L 27/3262* (2013.01); *H01L 27/3265* (2013.01); *H01L 2251/5338* (2013.01); *Y02E 10/549* (2013.01)

(58) Field of Classification Search
CPC ............ H01L 51/5253; H01L 27/3276; H01L 51/0097; H01L 27/3262; H01L 27/3265; H01L 2251/5338; Y02E 10/549
See application file for complete search history.

(56) References Cited

U.S. PATENT DOCUMENTS

| | | | | |
|---|---|---|---|---|
| 9,521,748 B1* | 12/2016 | Bergman | ............. | H05K 1/0393 |
| 2003/0047534 A1* | 3/2003 | Takasugi | ................ | G11B 5/105 |
| | | | | 216/27 |
| 2005/0280157 A1* | 12/2005 | Roush | ................. | H01L 23/4985 |
| | | | | 257/773 |
| 2013/0169515 A1* | 7/2013 | Prushinskiy | .......... | G06F 1/1652 |
| | | | | 345/55 |
| 2014/0217397 A1* | 8/2014 | Kwak | ................. | H01L 27/1218 |
| | | | | 257/43 |

FOREIGN PATENT DOCUMENTS

| | | |
|---|---|---|
| KR | 10-2014-0045193 A | 4/2014 |
| KR | 10-2014-0103025 A | 8/2014 |
| KR | 10-2014-0122960 A | 10/2014 |
| KR | 10-2015-0015257 A | 2/2015 |

* cited by examiner

*Primary Examiner* — Peter Bradford
(74) *Attorney, Agent, or Firm* — F. Chau & Associates, LLC

(57) ABSTRACT

A flexible display and manufacturing method thereof are disclosed. In one aspect, the flexible display includes a flexible substrate including a bending area, an insulating layer disposed on the flexible substrate, and at least one groove in the insulating layer within the bending area. The flexible display also includes a stress relaxation layer disposed on the at least one groove and a plurality of wires formed over the insulating layer and the stress relaxation layer.

19 Claims, 20 Drawing Sheets

FLEXIBLE DISPLAY HAVING GROOVED INSULATING LAYER AND MANUFACTURING METHOD THEREOF

RELATED APPLICATIONS

This application claims priority to and the benefit of Korean Patent Application No. 10-2015-0118837 filed in the Korean Intellectual Property Office on Aug. 24, 2015, the entire contents of which are incorporated herein by reference

BACKGROUND

Field

The described technology generally relates to a flexible display and a manufacturing method thereof, and more particularly, to a flexible display device with a bending area.

Description of the Related Technology

Since organic light-emitting diode (OLED) displays are self-luminous, they do not require a separate light source, in contrast to liquid crystal displays (LCDs). This can enable the manufacture of OLED displays that are relatively thin and lightweight compared to LCDs. In addition, OLED displays have other high-quality characteristics, such as low power consumption, high luminance, fast response speeds, etc.

OLED displays include a substrate, a thin film transistor formed on the substrate, an OLED which is controlled by the thin film transistor, and a plurality of insulating layers formed between electrodes of the thin film transistor. Recently, flexible OLED displays have been developed that include a flexible substrate in which a bending area is formed.

The above information disclosed in this Background section is only intended to facilitate the understanding of the background of the described technology and therefore it may contain information that does not form the prior art that is already known in this country to a person of ordinary skill in the art.

SUMMARY OF CERTAIN INVENTIVE ASPECTS

One inventive aspect is a flexible display and a manufacturing method thereof that can suppress cracking and the spread of cracking in an insulating layer due to bending of the flexible display along a bending area.

Another aspect is a flexible display device including: a flexible substrate including a bending area; an insulating layer disposed on the flexible substrate; a groove in the insulating layer within the bending area; a stress relaxation layer disposed on the groove; and a plurality of wires disposed on the insulating layer and the stress relaxation layer.

The flexible substrate can further include a display area, and the bending area can be positioned outside the display area. The flexible display device can further include a display unit located in the display area. The plurality of wires can be electrically connected to the display unit. The stress relaxation layer can contact the flexible substrate.

The bending area can be bent based on the bending axis, and the groove of the insulating layer can extend along a direction parallel to the bending axis. The groove of the insulating layer can be formed in a plurality, and a plurality of grooves can be spaced apart from each other along a length direction of the plurality of wires.

A top surface of the stress relaxation layer and a top surface of the insulating layer can be positioned at the same height from a surface of the flexible substrate. The insulating layer can include a plurality of inorganic layers stacked on the flexible substrate, and the groove of the insulating layer can be located in at least one inorganic layer including the topmost inorganic layer of the plurality of inorganic layers.

The plurality of inorganic layers can include at least two of a barrier layer, a buffer layer, a gate insulating layer, and an interlayer insulating layer. The plurality of wires can be covered by an organic layer. The stress relaxation layer can include an organic insulation material.

Another aspect is a flexible display device including: a flexible substrate, an inorganic insulating layer, a groove, an organic insulating layer, and a plurality of wires. The flexible substrate can include a display area in which a display unit is located and a bending area outside the display area. The inorganic insulating layer can be disposed on the flexible substrate. The groove can be located in the inorganic insulating layer within the bending area. The organic insulating layer can be disposed on the groove. The plurality of wires can be electrically connected to the display unit, and can respectively include a first portion disposed on a top surface of the inorganic insulating layer and a second portion disposed on a top surface of the organic insulating layer.

The first portion and the second portion can be positioned at the same height from a surface of the flexible substrate. The bending area can be bent based on a bending axis, and the groove of the inorganic insulating layer can extend along a direction parallel to the bending axis.

The organic insulating layer can contact the flexible substrate. The inorganic insulating layer can include a barrier layer, a buffer layer, a gate insulating layer, and an interlayer insulating layer that are sequentially stacked on the flexible substrate. The groove of the inorganic insulating layer can be located in at least one of the barrier layer, the buffer layer, the gate insulating layer, and the interlayer insulating layer.

Another aspect is a manufacturing method of a flexible display device, including: forming an insulating layer on a display area and a non-display area of a flexible substrate; forming a groove in the insulating layer within the non-display area; forming a stress relaxation layer by filling the groove with an organic insulation material; forming a plurality of wires on the insulating layer and the stress relaxation layer within the non-display area; and forming a bending area by bending at least some of the non-display area.

The bending area can be bent based on a bending axis, and the groove of the insulating layer can extend along a direction parallel to the bending axis.

A top surface of the stress relaxation layer and a top surface of the insulating layer can be positioned at the same height from a surface of the flexible substrate. The insulating layer can include a plurality of inorganic layers stacked on the flexible substrate, and the groove of the insulating layer can be located in at least one inorganic layer including the topmost inorganic layer of the plurality of inorganic layers.

According to at least one embodiment, it is possible to reduce or prevent cracking and the spread of cracking in an insulating layer of a flexible display device by reducing stress on a bending area thereof. Further, it is possible to prevent the occurrence of a step shape being formed in wires by providing a flat surface over which the wires are formed by using a stress relaxation layer, such that short circuit(s) between the wires can be prevented.

DETAILED DESCRIPTION OF CERTAIN INVENTIVE EMBODIMENTS

Figure 1:
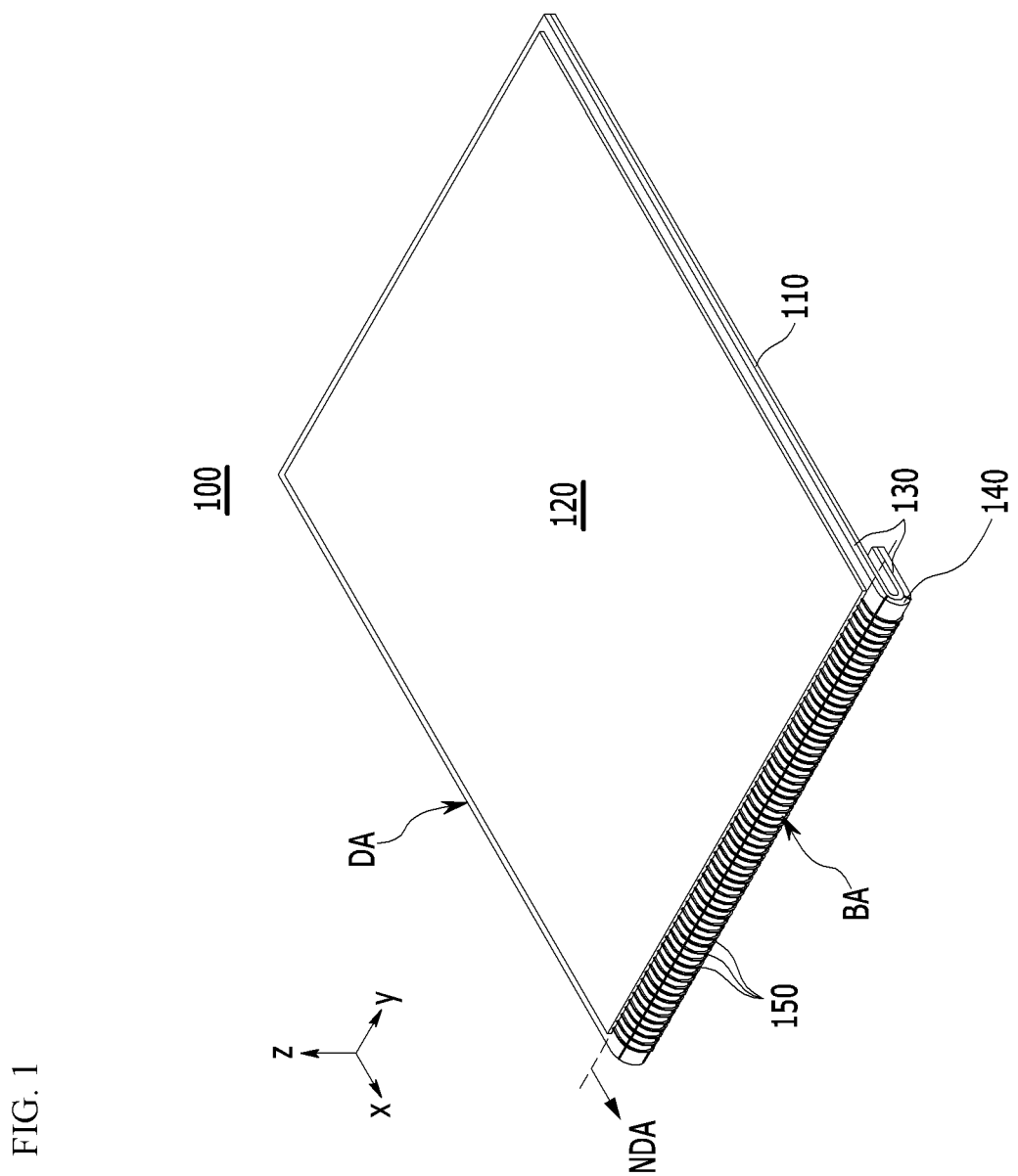
FIG. 1 illustrates a schematic perspective view of a flexible display according to an exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Throughout the specification, it will be understood that when an element such as a layer, film, region, or substrate is referred to as being "on" another element, it may be directly on the other element or intervening elements may also be present. Further, the word "on" means positioned on or below the object, and does not necessarily mean positioned on the upper side of the object based on the orientation of the object with respect to the direction of gravity.

Throughout the specification, unless explicitly described to the contrary, the word "comprise" will be understood to imply the inclusion of stated elements, but not the exclusion of any other elements. In the drawings, the sizes and thicknesses of respective elements may be exaggerated for the sake of clarity, and the present disclosure is not necessarily limited to such illustrated sizes and thicknesses.

Figure 2:
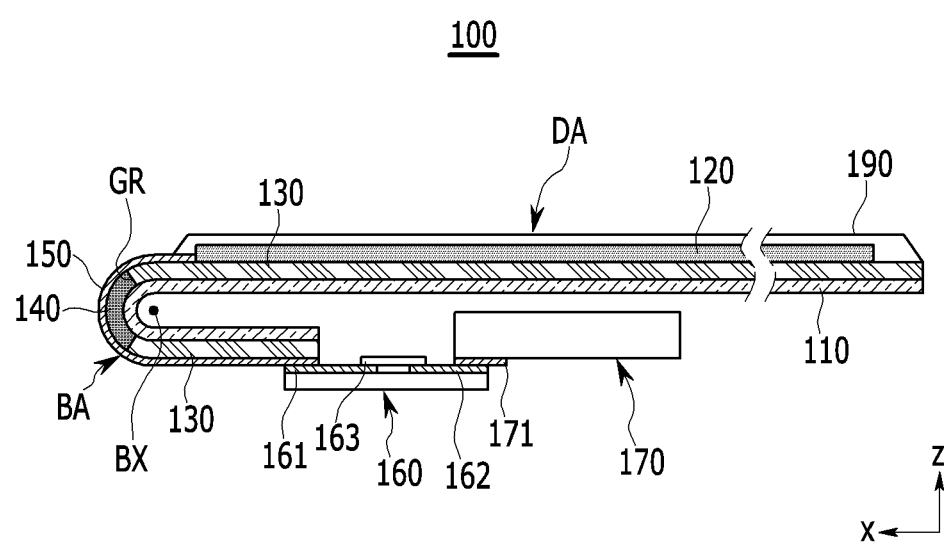
FIG. 2 illustrates a schematic cross-sectional view of a flexible display according to an exemplary embodiment.
Figure 3:
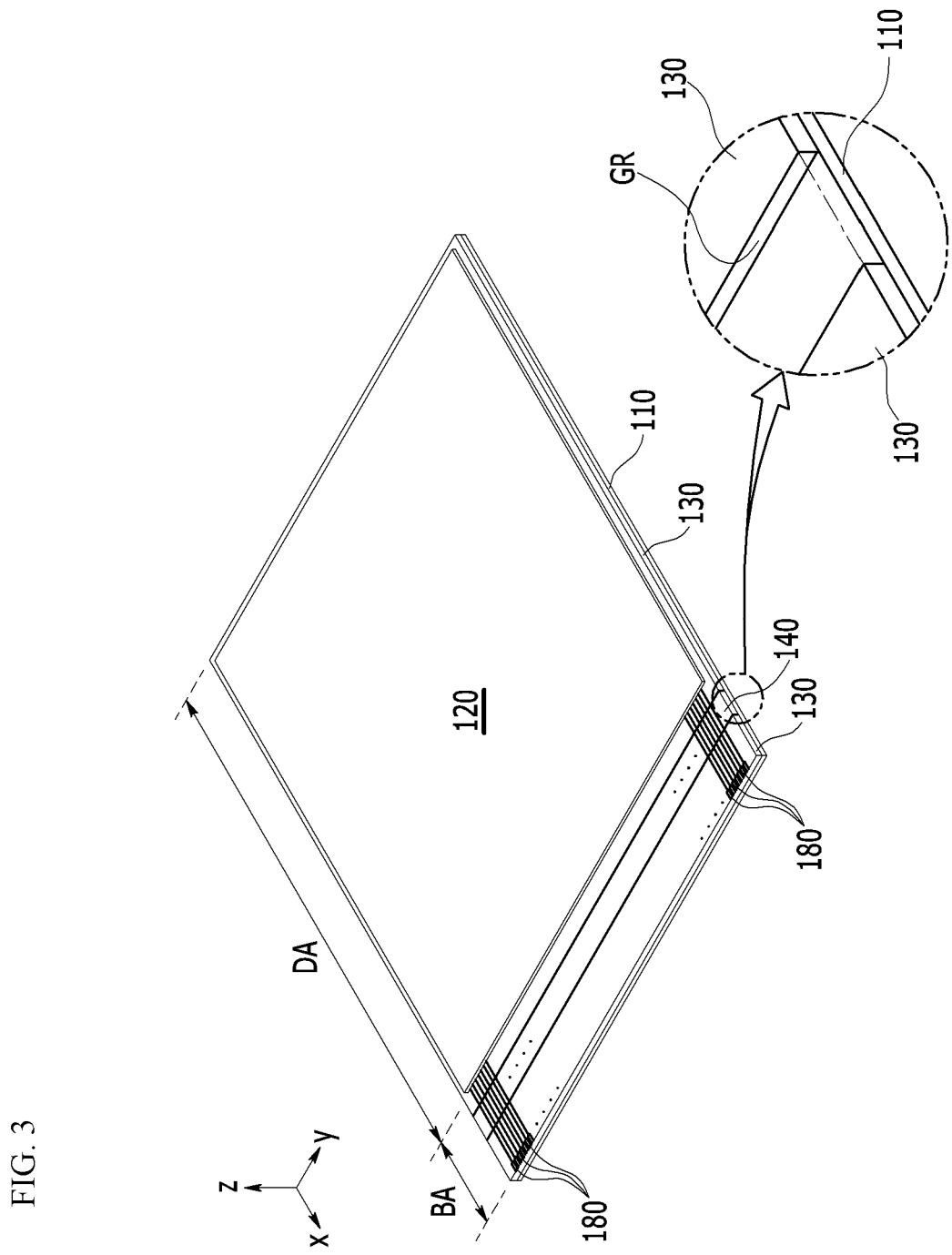
FIG. 3 illustrates a schematic perspective view of the flexible display illustrated in FIG. 1 in an unfolded configuration.

FIGS. 1 and 2 respectively illustrate a schematic perspective view and a schematic cross-sectional view of a flexible display according to an exemplary embodiment. FIG. 3 illustrates a schematic perspective view of the flexible display device illustrated in FIG. 1 in an unfolded configuration.

Referring to FIGS. 1 to 3, a flexible display 100 includes a flexible substrate 110, a display unit 120, an insulating layer 130, a stress relaxation layer 140, and a plurality of wires 150 that are disposed on the flexible substrate 110. Further, the flexible display 100 can further include a chip on film (COF) 160 (or a flexible printed circuit (FPC)) and a printed circuit board (PCB) 170.

The flexible substrate 110 can be formed of an organic material including at least one of polyimide, polycarbonate, polyethylene, polyethylene terephthalate, and polyacrylate. The flexible substrate 110 can be bendable and can be light transmissive.

The flexible substrate 110 includes a display area (DA) within the display unit 120. The display unit 120 includes a plurality of pixels, and can display an image via a combination of light emitted from the pixels PX. Each of the pixels PX includes a pixel circuit and an organic light-emitting diode (OLED). The pixel circuit includes at least two thin film transistors and at least one storage capacitor and can control the emission of light from the OLED. A detailed structure of the display unit 120 will be described below.

The flexible substrate 110 includes a bending area (BA). The flexible substrate 110 includes a non-display area (NDA) surrounding the display area (DA), and the bending area (BA) can be included in the non-display area. For example, the bending area (BA) can be a pad region included in the non-display area.

A plurality of pad electrodes 180 are disposed on an edge of the flexible substrate 110 in the pad region. A plurality of wires 150 are disposed on the pad region and the wires 150 electrically connect a plurality of signal lines (e.g., scan lines, data lines, driving voltage lines, etc.) that are respectively located in the display unit 120 to a plurality of pad electrodes 180.

The pad electrodes 180 are connected to an output wire portion 161 of the chip on film 160, and an input wire portion 162 of the chip on film 160 is connected to an output wire portion 171 of the printed circuit board (PCB) 170. In FIG. 2, reference numeral 163 denotes a driving chip mounted on the chip on film 160. The printed circuit board (PCB) 170 outputs a control signal for controlling the driving chip 163 to the chip on film 160. The chip on film 160 outputs various signals and power to the pad electrodes 180 in order to display images.

When the pad region is arranged to be parallel to the display area (DA) (refer to FIG. 3), the dead space outside of the display unit 120 increases. The pad region of the flexible display device 100 of the present exemplary embodiment can be bent to form the bending area (BA). Then, since the edge of the flexible substrate 110 on which the pad electrodes 180 are located overlaps the display area (DA) at a rear side of the display area (DA), the dead space outside of the display unit 120 can be reduced or minimized.

The bending area (BA) is bent with respect to a bending axis (BX) (refer to FIG. 2). A center of curvature of the bending area (BA) is positioned at the bending axis (BX). The bending axis (BX) is parallel to an x-axis with reference to FIGS. 1 and 2.

The insulating layer (or inorganic insulating layer) 130 is disposed on the entire flexible substrate 110, and the wires 150 are disposed on the insulating layer 130. The insulating layer 130 is interposed between electrodes included in the display unit 120 to electrically insulate the electrodes from each other. The insulating layer 130 can include a plurality of layers, such as a barrier layer, a buffer layer, a gate insulating layer, an interlayer insulating layer, etc., and can include an inorganic material such as a silicon oxide ($SiO_2$) or silicon nitride (SiNx). The wires 150 include metal.

The insulating layer 130 can be considerably less flexible than the wires 150 and can be brittle leading to the insulating layer 130 being vulnerable to being broken when applied with external force(s). Accordingly, the insulating layer 130 of the bending area (BA) can be broken by tensile force caused by bending, such that crack(s) can be formed, and an initially occurring crack can be spread to other areas of the insulating layer 130. A crack in the insulating layer 130 can lead to open circuits in the wires 150, which leads to display defects in the flexible display device 100.

In the flexible display device 100 of at least one exemplary embodiment, the insulating layer 130 includes a groove (GR) located in the bending area (BA), and the stress relaxation layer (or organic insulating layer) 140 is disposed on the groove (GR) of the insulating layer 130. The groove (GR) and the stress relaxation layer 140 can extend along a direction (y-axis direction) parallel to the bending axis (BX). FIG. 2 illustrates the exemplary embodiment in which one groove (GR) and one stress relaxation layer 140 are located in the insulating layer 130.

Figure 4:
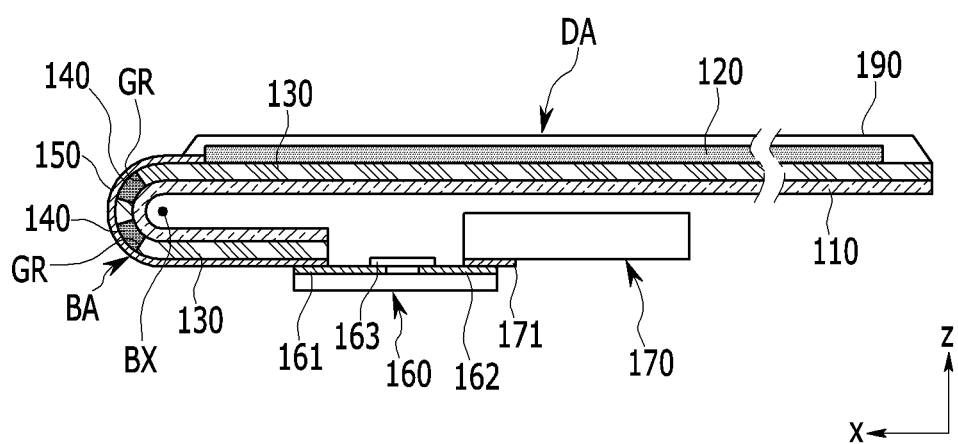
FIG. 4 illustrates a cross-sectional view of an exemplary variation of the flexible display illustrated in FIG. 2.

FIG. 4 illustrates a cross-sectional view of an exemplary variation of the flexible display illustrated in FIG. 2. In FIG. 4, the insulating layer 130 includes a plurality of grooves (GR) and a plurality of stress relaxation layers 140 that are respectively spaced apart from each other along a length direction of the wire 150. The grooves (GR) and the stress relaxation layers 140 respectively extend along the direction (y-axis direction) parallel to the bending axis (BX).

Although two grooves (GR) and two stress relaxation layers 140 are exemplarily shown in FIG. 4, the number and the position of the groove (GR) and the stress relaxation layer 140 are not limited to those shown in FIG. 4.

Referring to FIGS. 1 to 4, the stress relaxation layer 140 is located to fill the groove (GR) of the insulating layer 130, and the wires 150 are disposed on the insulating layer 130 and the stress relaxation layer 140. The thickness of the stress relaxation layer 140 is substantially equal to a depth of the groove (GR). Accordingly, a top surface of the stress relaxation layer 140 and a top surface of the insulating layer 130 are positioned at substantially the same height from a surface of the flexible substrate 110, and the wires 150 do not have a step in height at a boundary between the insulating layer 130 and the stress relaxation layer 140.

For example, the wires 150 are positioned flat from one side contacting the electrode of the display unit 120 to the other side contacting the pad electrode 180 without bending. Here, "bending" means to being bent in a thickness direction (z-axis direction) of the flexible substrate 110.

The stress relaxation layer 140 includes a material that is less brittle and more flexible than the insulating layer 130. For example, the stress relaxation layer 140 can include an organic insulation material, and can include at least one of polyimide, acrylate, and epoxy. The stress relaxation layer 140 can fill the entire groove (GR), and tightly contacts a lateral wall of the groove (GR) so that no gap(s) are formed between the insulating layer 130 and the groove (GR).

The flexible display device 100 of the present exemplary embodiment can reduce or prevent the occurrence of cracking in the insulating layer 130 due to bending stress by the groove (GR) in the insulating layer 130 of the bending area (BA). In addition, it is possible to prevent a step from occurring in the wires 150 traversing the bending area (BA) by the stress relaxation layer 140 in the groove (GR) of the insulating layer 130.

When the wires 150 are disposed after forming the groove (GR) in the insulating layer 130 when there is no stress relaxation layer, the wires 150 are located to have a large step along the thickness direction (z-axis direction) of the flexible substrate 110. In this situation, when the wires 150 are formed by depositing a metal layer and then patterning the metal layer through a method such as photolithography, the metal layer may remain in an undesired region, thus leading to short circuit(s) between the wires 150.

In the flexible display device 100 of at least one exemplary embodiment, the stress relaxation layer 140 can fill the groove (GR) of the insulating layer 130 to form a substantially flat surface. Accordingly, when the wires 150 are formed by depositing the metal layer and then patterning the metal layer, since it is possible to accurately perform the patterning, the short circuit between the wires 150 can be prevented. For reference, the wires 150 are formed in the flat pad region, and then the pad region is bent for the bending area (BA) to be formed.

Figure 5A:
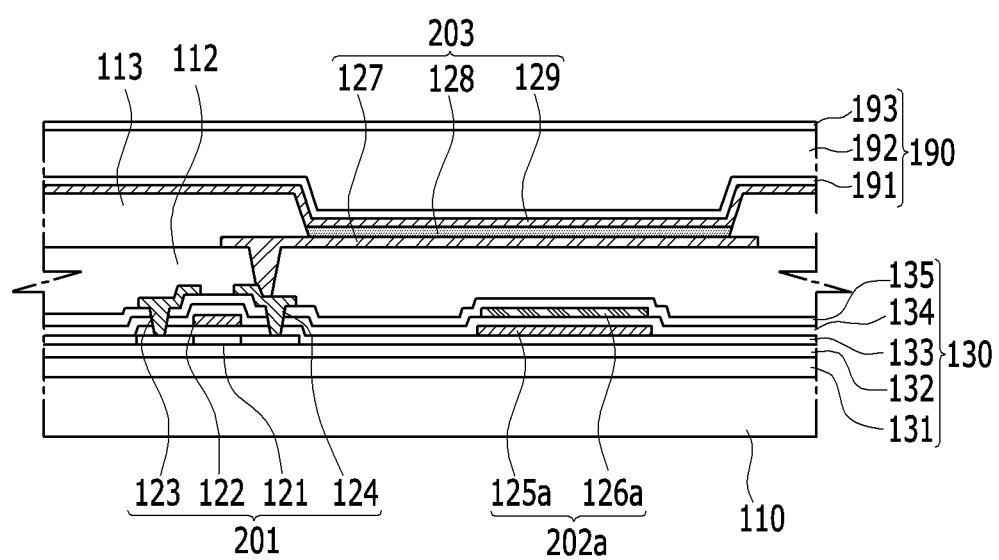
FIG. 5A illustrates an enlarged cross-sectional view of a display unit of the flexible display illustrated in FIG. 3.
Figure 6:
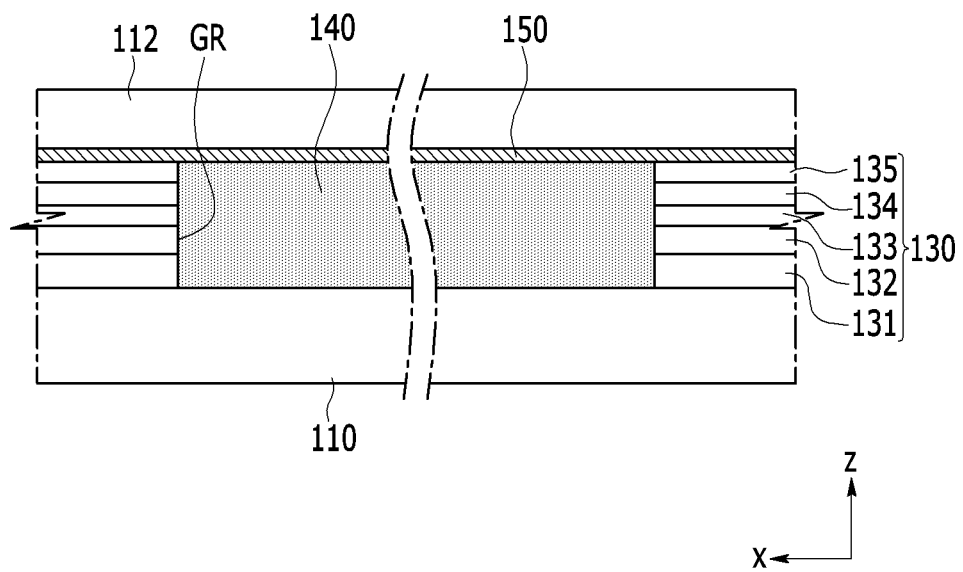
FIG. 6 illustrates an enlarged cross-sectional view of a bending area of the flexible display illustrated in FIG. 3.

FIGS. 5A and 6 respectively illustrate an enlarged cross-sectional view of a display unit and a bending area of the flexible display device illustrated in FIG. 3.

Referring to FIGS. 5A and 6, a barrier layer 131 can be disposed on the flexible substrate 110. The barrier layer 131 serves to block moisture and/or oxygen from permeating through the flexible substrate 110, and can be formed with a plurality of layers in which silicon oxides ($SiO_2$) and silicon nitrides (SiNx) are alternatively and repeatedly stacked on each other. A buffer layer 132 can be disposed on the barrier layer 131. The buffer layer 132 provides a flat surface for forming a pixel circuit, and can include a silicon oxide ($SiO_2$) or a silicon nitride (SiNx).

A semiconductor layer 121 is disposed on the buffer layer 132. The semiconductor layer 121 can include a polysilicon or oxide semiconductor, and the semiconductor layer 121 including the oxide semiconductor can be covered by a separate passivation layer (not shown). The semiconductor layer 121 includes a channel region, which is not doped with an impurity, and a source region and a drain region, which are positioned at opposite sides of the channel region and are doped with an impurity.

A gate insulating layer 133 is disposed on the semiconductor layer 121. The gate insulating layer 133 can be formed as a single layer of a silicon nitride (SiNx) or a silicon oxide ($SiO_2$) or a stacked layer of a silicon nitride (SiNx) and a silicon oxide (SiO2). A gate electrode 122 and a first capacitor plate 125a are disposed on the gate insulating layer 133. The gate electrode 122 overlaps a channel region of the semiconductor layer 121.

A first interlayer insulating layer 134 can be disposed on the gate electrode 122 and the first capacitor plate 125a, and a second capacitor plate 126a is disposed on the first interlayer insulating layer 134. The second capacitor plate 126a overlaps the first capacitor plate 125a, and the first capacitor plate 125a and the second capacitor plate 126a form a storage capacitor 202a using the first interlayer insulating layer 134 as a dielectric material. The gate electrode 122 and the first and second capacitor plates 125a and 126a can include one or more of: Au, Ag, Cu, Ni, Pt, Pd, Al, Mo, etc.

A second interlayer insulating layer 135 can be disposed on the second capacitor plate 126a, and a source electrode 123 and a drain electrode 124 are disposed on the second interlayer insulating layer 135. The first and second interlayer insulating layers 134 and 135 can be formed as a single layer of a silicon oxide ($SiO_2$) or a silicon nitride (SiNx) or a stacked layer of a silicon oxide ($SiO_2$) or a silicon nitride (SiNx).

The source electrode 123 and the drain electrode 124 are respectively connected to the source region and the drain region of the semiconductor layer 121 through a via hole formed in the first and second interlayer insulating layers 134 and 135 and the gate insulating layer 133. The source electrode 123 and the drain electrode 124 can be formed as a metal multilayer such as Mo/Al/Mo or Ti/Al/Ti. On the other hand, the second capacitor plate 126a can include the same material as the source and drain electrodes 123 and 124, and in this case, one interlayer insulating layer is provided.

The pixel circuit includes a switching thin film transistor, a driving thin film transistor 201, and a storage capacitor 202a, but the switching thin film transistor is omitted in FIG. 5A to facilitate the understanding of the pixel circuit and for convenience. Further, the structures of the driving thin film transistor 201 and the storage capacitor 202a are not limited to those of FIG. 5A.

Figure 5B:
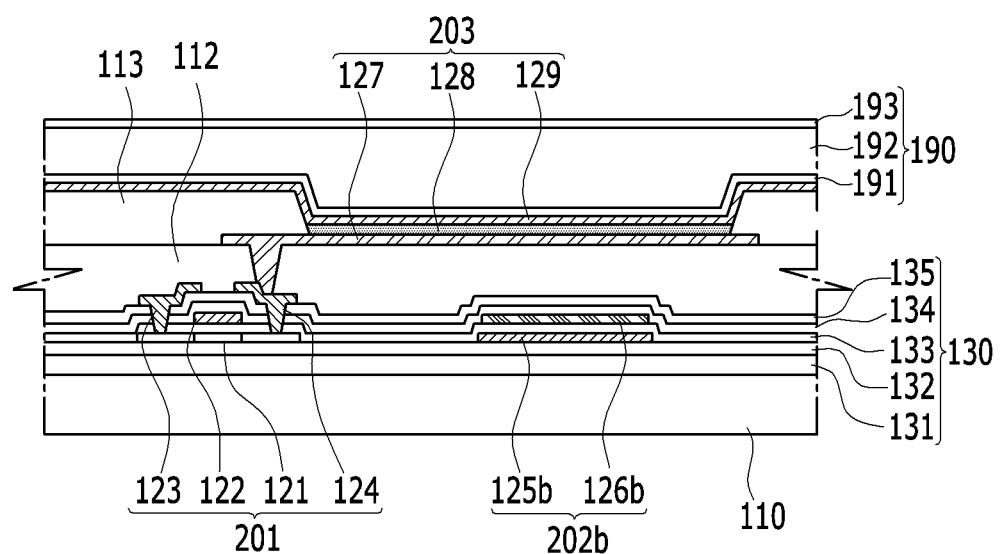
FIGS. 5B, 5C, and 5D respectively illustrate exemplary variations of FIG. 5A.
Figure 5C:
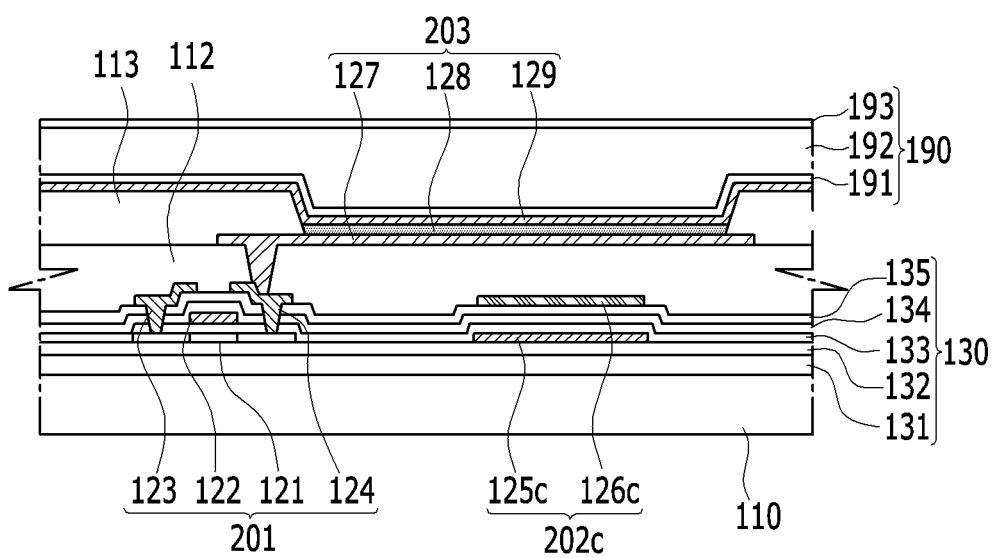
Figure 5D:
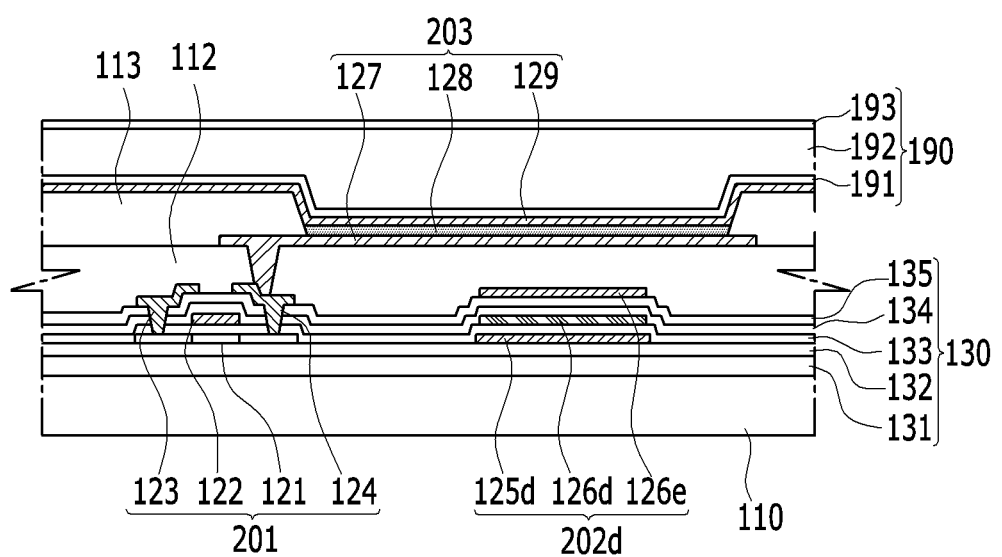

FIGS. 5B, 5C, and 5D respectively illustrate other examples of the storage capacitor.

Referring to FIG. 5B, a first capacitor plate 125b can include the same material as the semiconductor layer 121 on the buffer layer 132, and a second capacitor plate 126b can include the same material as the gate electrode 122 on the gate insulating layer 133. In this embodiment, the first capacitor plate 125b and the second capacitor plate 126b form a storage capacitor 202b using the gate insulating layer 133 as a dielectric material.

Referring to FIG. 5C, a first capacitor plate 125c can include the same material as the semiconductor layer 121 on the buffer layer 132, and the second capacitor plate 126c can include the same material as the source electrode 123 and the drain electrode 124 on the second interlayer insulating layer 135. In this embodiment, the first capacitor plate 125c and the second capacitor plate 126c form a storage capacitor 202c using the gate insulating layer 133, the first interlayer insulating layer 134, and the second interlayer insulating layer 135 as a dielectric material.

Referring to FIG. 5D, the storage capacitor 202d can include a first capacitor plate 125d, a second capacitor plate 126d, and a third capacitor plate 126e. The first capacitor plate 125d can include the same material as the semiconductor layer 121 on the buffer layer 132, and the second capacitor plate 126d can include the same material as the gate electrode 122 on the gate insulating layer 133. The third capacitor plate 126e can include the same material as the source electrode 123 and the drain electrode 124 on the second interlayer insulating layer 135.

The structures of the storage capacitors (202a, 202b, 202c, and 202d) are not limited to those shown in FIGS. 5A to 5D, and they can be variously modified.

Referring back to FIGS. 5A and 6, the driving thin film transistor 201 is covered by a planarization layer 112, and connected to an OLED 203 to drive the OLED 203. The planarization layer 112 can include an organic insulation material or an inorganic insulation material, or can be formed of a combination of the organic insulation material and the inorganic insulation material. The OLED 203 includes a pixel electrode 127 and an emission layer 128, and a common electrode 129.

The pixel electrode 127 is separately formed in each pixel on the planarization layer 112, and is connected to the drain electrode 124 of the driving thin film transistor 201 through a via hole formed on the planarization layer 112. A pixel-defining layer (or partition wall) 113 is disposed on the planarization layer 112 and on an edge of the pixel electrode 127. The emission layer 128 is disposed on the pixel electrode 127, and the common electrode 129 is disposed on the entire display area (DA) regardless of the pixels.

One of the pixel electrode 127 and the common electrode 129 injects holes into the emission layer 128, and the other injects electrons into the emission layer 128. The electrons and holes are recombined with each other in the emission layer 128 to generate an exciton, and light is emitted by energy generated when the exciton falls from an excited state to a ground state.

The pixel electrode 127 can include a reflective layer, and the common electrode 129 can include a transparent layer or a semi-transmissive layer. Light emitted from the emission layer 128 is reflected by the pixel electrode 127, and passes through the common electrode 129 to be emitted to the environment. When the common electrode 129 includes the semi-transmissive layer, some of light reflected by the pixel electrode 127 is re-reflected by the common electrode 129, thus the pixel electrode 127 and the common electrode 129 form a resonant structure, such that light-extracting efficiency can be improved.

The OLED 203 is covered by an encapsulator or encapsulation layer 190. The encapsulator 190 seals the OLED 203, such that deterioration of the OLED 203 caused by moisture and/or oxygen included in the environment can be reduced or prevent. The encapsulator 190 can include a structure in which inorganic layers and organic layers are stacked, for example, the encapsulator 190 can include a first inorganic layer 191, an organic layer 192, and a second inorganic layer 193.

In the bending area (BA), the wires 150 (FIG. 6 illustrates one wire) can be located in the same layer as the source and drain electrodes 123 and 124 and can include with the same material as the source and drain electrodes 123 and 124. The wire 150 can be covered by the organic layer, for example, the planarization layer 112. The insulating layer 130 below the wire 150, which includes multiple layers, can include the barrier layer 131, the buffer layer 132, the gate insulating layer 133, and the first and second interlayer insulating layers 134 and 135.

The groove (GR) of the insulating layer 130 can be located in the entire insulating layer 130 along the thickness direction (z-axis direction) of the flexible substrate 110. In this case, the stress relaxation layer 140 contacts the flexible substrate 110. Further, the groove (GR) of the insulating layer 130 can be located in a subset of the insulating layer 130, and can be located in at least one inorganic layer including the topmost inorganic layer 135 of the inorganic layers (131, 132, 133, 134, and 135) forming the insulating layer 130.

Figure 7A:
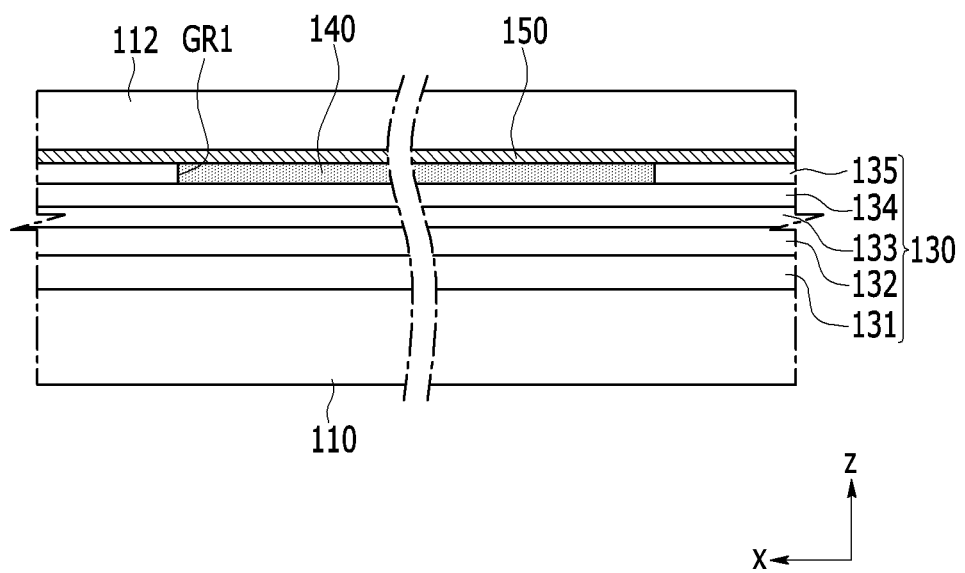
FIG. 7A illustrates an enlarged cross-sectional view of a first exemplary variation of the bending area illustrated in FIG. 6.
Figure 7B:
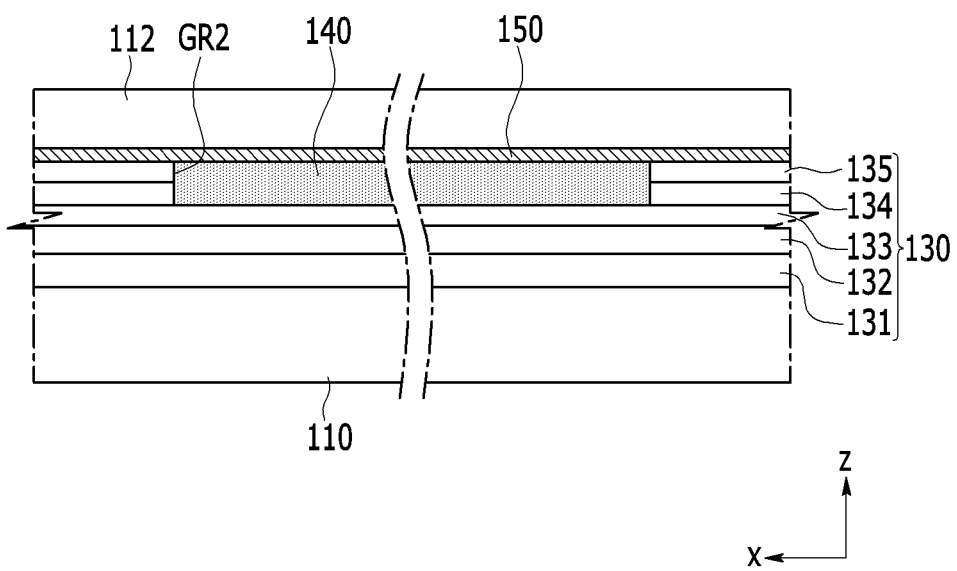
FIG. 7B illustrates an enlarged cross-sectional view of a second exemplary variation of the bending area illustrated in FIG. 6.

FIG. 7A illustrates an enlarged cross-sectional view of a first exemplary variation of the bending area illustrated in FIG. 6. Referring to FIG. 7A, a groove GR1 of the insulating layer 130 can be located in the second interlayer insulating layer 135. FIG. 7B illustrates an enlarged cross-sectional view of a second exemplary variation of the bending area illustrated in FIG. 6. Referring to FIG. 7B, a groove GR2 of the insulating layer 130 can be located in the first interlayer insulating layer 134 and the second interlayer insulating layer 135.

Figure 7C:
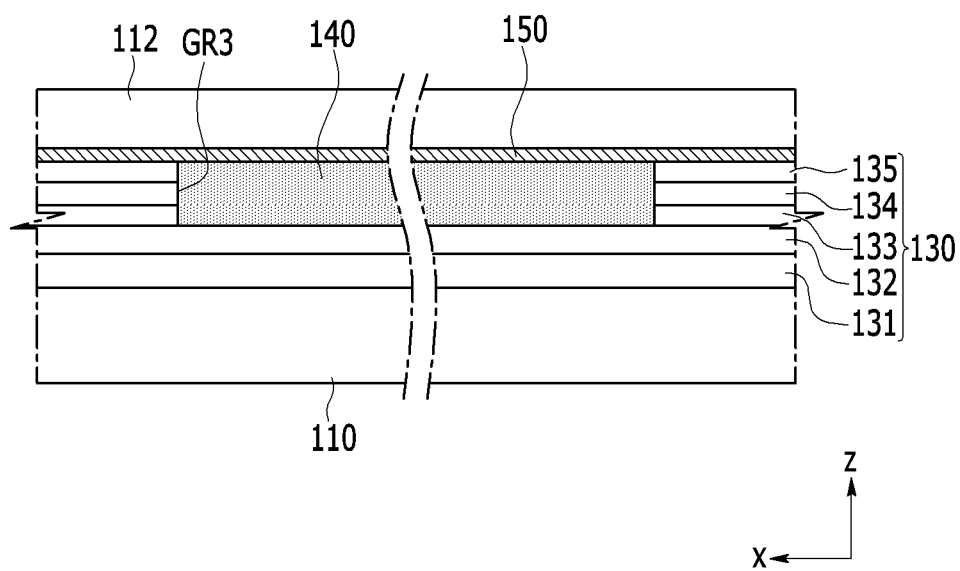
FIG. 7C illustrates an enlarged cross-sectional view of a third exemplary variation of the bending area illustrated in FIG. 6.
Figure 7D:
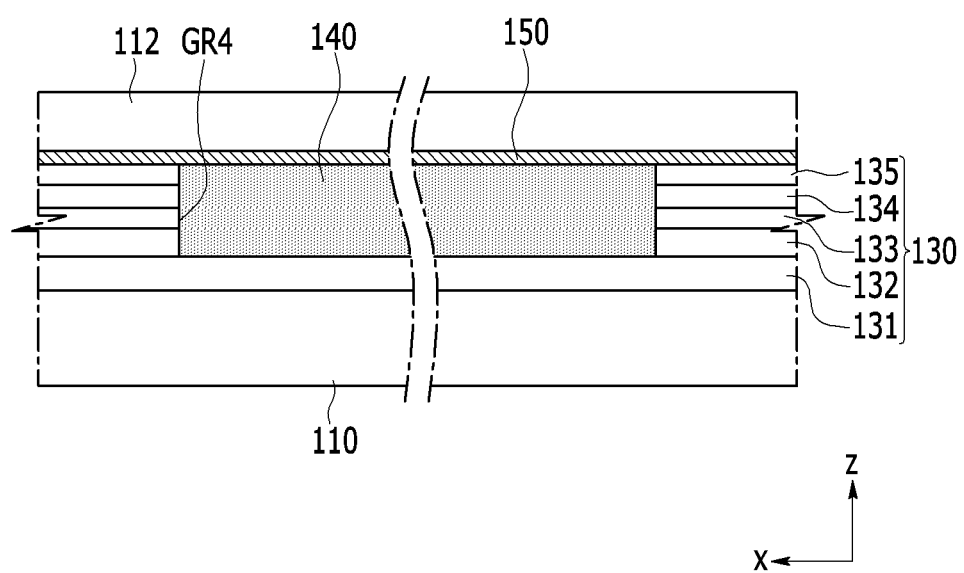
FIG. 7D illustrates an enlarged cross-sectional view of a fourth exemplary variation of the bending area illustrated in FIG. 6.

FIG. 7C illustrates an enlarged cross-sectional view of a third exemplary variation of the bending area illustrated in FIG. 6. Referring to FIG. 7C, a groove GR3 of the insulating layer 130 can be located in the gate insulating layer 133 and the first and second interlayer insulating layers 134 and 135. FIG. 7D illustrates an enlarged cross-sectional view of a fourth exemplary variation of the bending area illustrated in FIG. 6. Referring to FIG. 7D, a groove GR4 of the insulating layer 130 can be located in the buffer layer 132, the gate insulating layer 133, and the first and second interlayer insulating layers 134 and 135.

In all the exemplary embodiments shown in FIG. 6 and FIGS. 7A to 7D, the grooves (GR, GR1, GR2, GR3, and GR4) of the insulating layer 130 are filled with the stress relaxation layer 140 to provide a substantially flat surface for locating the wires 150.

Figure 8:
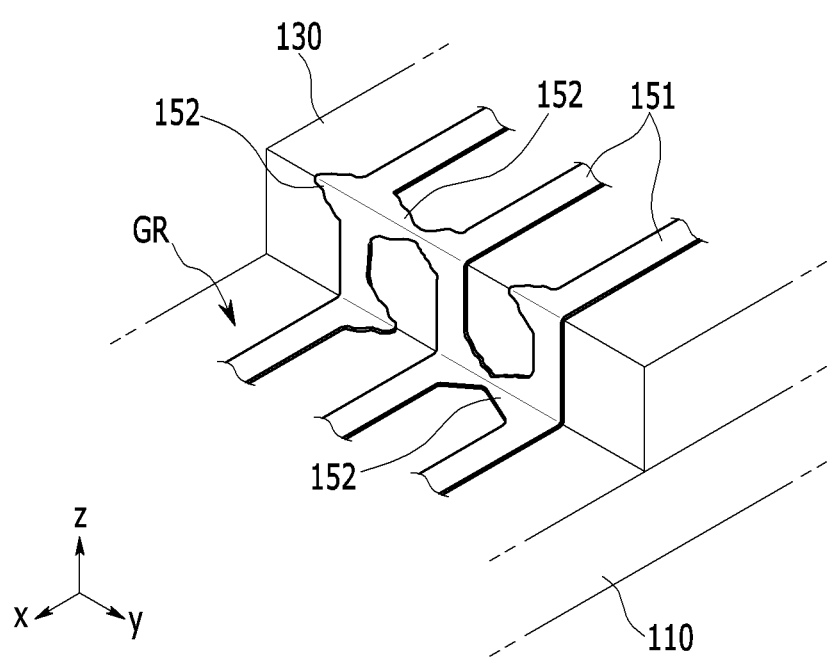
FIG. 8 illustrates an enlarged perspective view of a bending area of a flexible display corresponding to a comparative example.

FIG. 8 illustrates an enlarged perspective view of a bending area of a flexible display corresponding to a comparative example.

Referring to FIG. 8, a flexible display of a comparative example does not include a stress relaxation layer. In this situation, the wires 151 are located along a top surface of the insulating layer 130, a lateral surface of the groove (GR), a bottom surface of the groove (GR) (e.g., a top surface of the flexible substrate 110), a lateral surface of the groove (GR), and the top surface of the insulating layer 130, and have a large step formed along the thickness direction (z-axis direction) of the flexible substrate 110.

Typically, the wires 151 are formed by depositing a metal layer over an entire surface and patterning the metal layer through a method such as photolithography. However, when a metal layer is formed on a non-flat surface with a step, the metal layer is not appropriately patterned in a region in which the step is formed, and thus the metal layer may remain in an undesired portion or region. The remaining metal layer can contact an adjacent wire 151 such that a short circuit is formed between the wires 151. Reference numeral 152 denotes an undesired remaining metal layer in FIG. 8.

However, in the flexible display 100 of at least one exemplary embodiment, since the stress relaxation layer 140 fills the groove (GR) of the insulating layer 130, the metal layer for the wires 150 is disposed on the flat surface. Accordingly, the wires 150 can be accurately patterned without the metal layer remaining, and thus the short circuit between the wires 150 can be prevented.

Figure 9:
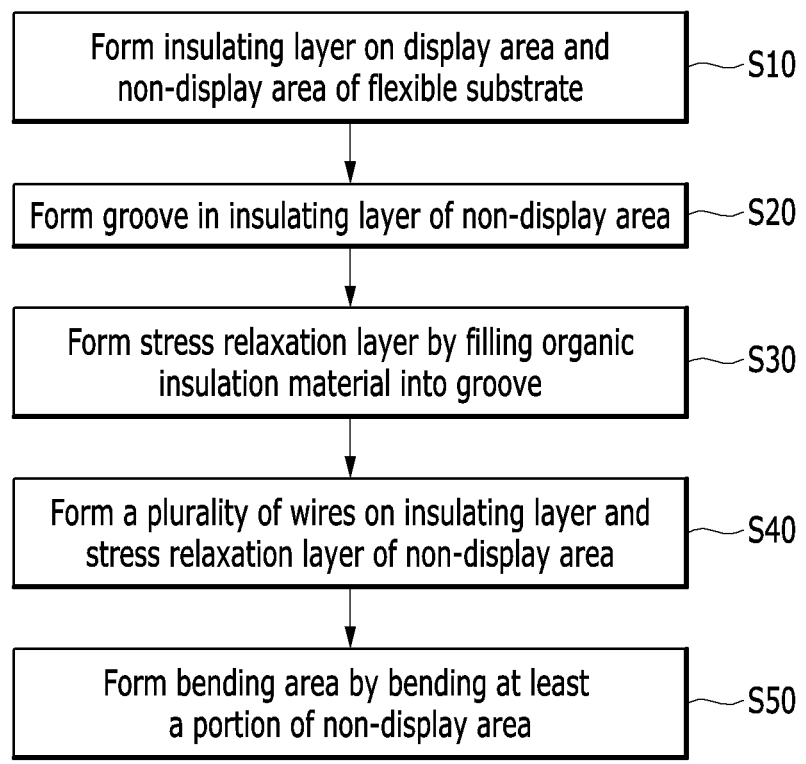
FIG. 9 illustrates a flowchart of a manufacturing method of a flexible display according to an exemplary embodiment.

FIG. 9 illustrates a flowchart of a manufacturing method of a flexible display according to an exemplary embodiment.

Referring to FIG. 9, a manufacturing method of the flexible display includes: a first step S10 for forming an insulating layer on a display area and a non-display area of a flexible substrate; a second step S20 for forming a groove in the insulating layer of the non-display area; a third step S30 for forming a stress relaxation layer by filling an organic insulation material into the groove; a fourth step S40 for forming a plurality of wires on the insulating layer and the stress relaxation layer of the non-display area; and a fifth step S50 for forming a bending area by bending at least a portion of the non-display area.

Figure 10A:
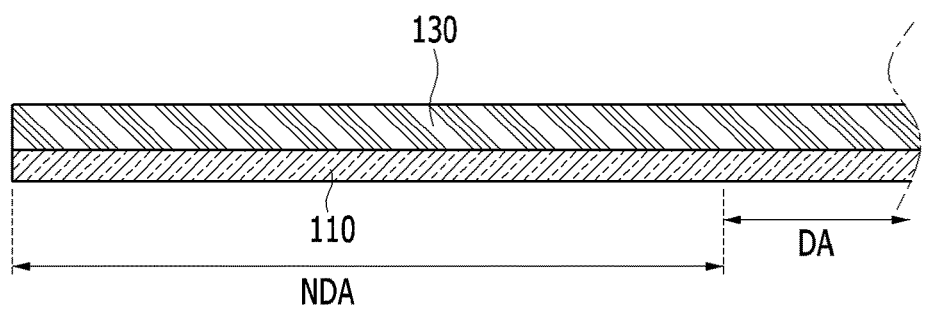
FIG. 10A illustrates a schematic cross-sectional view of a flexible display at a first step illustrated in FIG. 9.

FIG. 10A illustrates a schematic cross-sectional view of a flexible display at a first step illustrated in FIG. 9.

Referring to FIG. 10A, a flexible substrate 110 can include an organic material including at least one of polyimide, polycarbonate, polyethylene, polyethylene terephthalate, and polyacrylate in first step S10. The flexible substrate 110 can be bendable and can be light transmissive.

The flexible substrate 110 can be divided into a display area (DA) in which a display unit is located and a non-display area (NDA) outside of the display area (DA). The insulating layer 130 is disposed on both the display area (DA) and the non-display area (NDA) of the flexible substrate 110. Although not illustrated, electrodes for forming thin film transistors and a storage capacitor are located in the display area (DA) while forming the insulating layer 130.

Figure 10B:
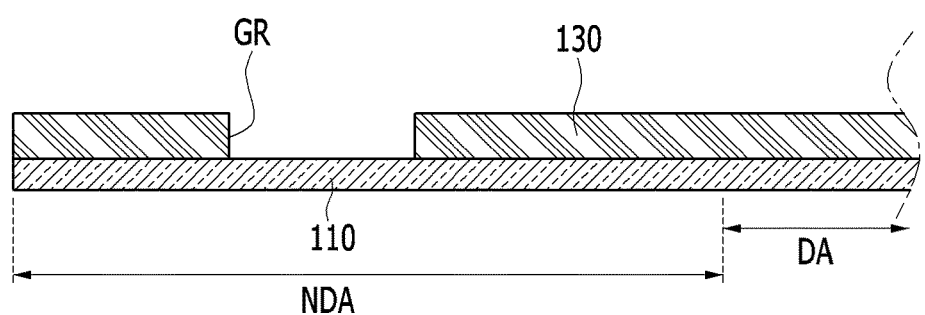
FIG. 10B illustrates a schematic cross-sectional view of a flexible display at a second step illustrated in FIG. 9.

FIG. 10B illustrates a schematic cross-sectional view of a flexible display at a second step illustrated in FIG. 9.

Referring to FIG. 10B, a groove (GR) is formed in the insulating layer 130 of the non-display area (NDA) in the second step S20. As shown in FIG. 6 and FIGS. 7A to 7D, the insulating layer 130 can include a plurality of inorganic layers (131, 132, 133, 134, and 135) stacked on the flexible substrate 110, and the groove (GR) of the insulating layer 130 can be located in at least one inorganic layer including the topmost inorganic layer 135 of the inorganic layers (131, 132, 133, 134, and 135).

Figure 10C:
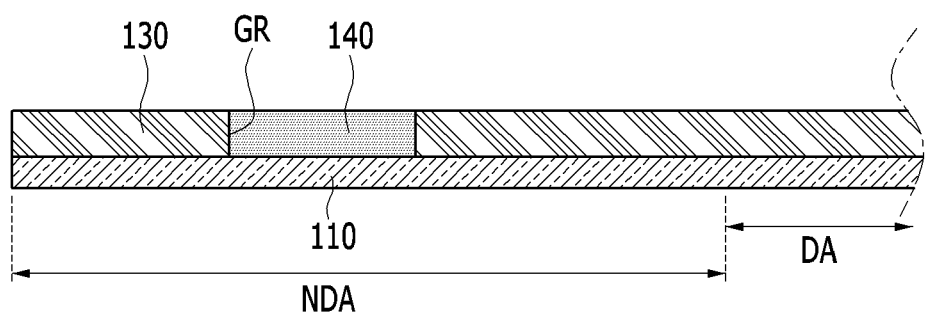
FIG. 10C illustrates a schematic cross-sectional view of a flexible display at a third step illustrated in FIG. 9.

FIG. 10C illustrates a schematic cross-sectional view of a flexible display at a third step illustrated in FIG. 9.

Referring to FIG. 10C, a stress relaxation layer 140 fills the groove (GR) of the insulating layer 130 formed in the third step S30. The stress relaxation layer 140 can include an organic insulation material, and the thickness of the stress relaxation layer 140 is substantially equal to a depth of the groove (GR). Accordingly, a top surface of the stress relaxation layer 140 and a top surface of the insulating layer 130 are positioned at substantially the same height from a surface of the flexible substrate 110.

Figure 10D:
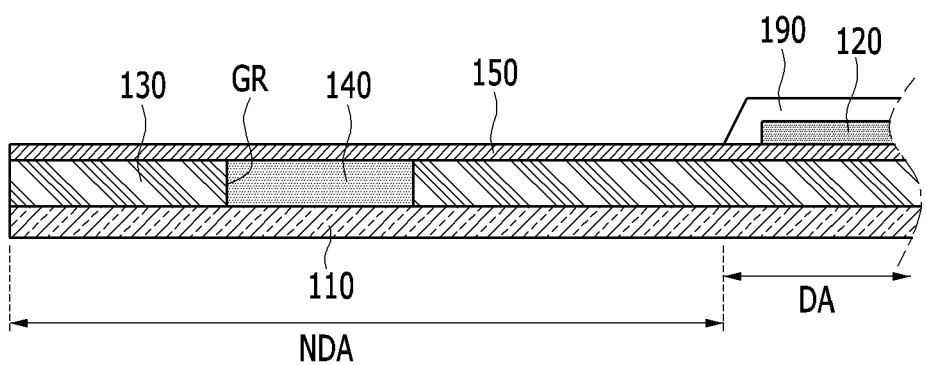
FIG. 10D illustrates a schematic cross-sectional view of a flexible display at a fourth step illustrated in FIG. 9.

FIG. 10D illustrates a schematic cross-sectional view of a flexible display at a fourth step illustrated in FIG. 9.

Referring to FIG. 10D, a plurality of wires 150 (FIG. 10D illustrates one wire) are formed on the insulating layer 130 of the non-display area (NDA) and the stress relaxation layer 140 in the fourth step S40. The wires 150 can be formed by depositing a metal layer on the insulating layer 130 and patterning the metal layer through a well-known photolithography process.

Although not illustrated, the remaining electrodes for forming thin film transistors in the display area (DA) can be formed while forming the wires 150. After the wires 150 are formed, a display unit 120, including a plurality of OLED and an encapsulator 190 sealing the display unit 120, can be formed in the display area (DA).

Further, a plurality of pad electrodes (not shown) can be formed at an edge of the flexible substrate 110 within the non-display area (NDA). The wires 150 can connect a plurality of signal lines formed in the display unit 120 to the pad electrodes.

Since the stress relaxation layer 140 fills the groove (GR) of the insulating layer 130, when a metal layer is deposited for forming the wires 150, a step is not formed in the metal layer. That is, there is no bending portion along the thickness direction of the flexible substrate 110 in the metal layer, and thus no remaining layer occurs when the metal layer is patterned, thereby preventing a short circuit between wires 150.

Figure 10E:
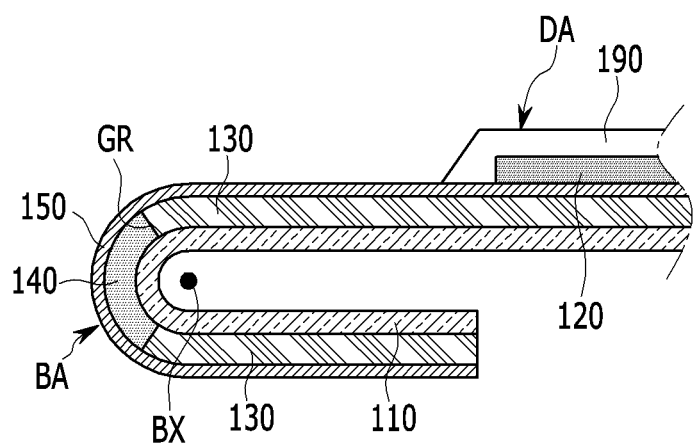
FIG. 10E illustrates a schematic cross-sectional view of a flexible display at a fifth step illustrated in FIG. 9.

FIG. 10E illustrates a schematic cross-sectional view of a flexible display at a fifth step illustrated in FIG. 9.

Referring to FIG. 10E, at least a portion of the non-display area (NDA) in which the wires 150 are formed is bent such that the bending area (BA) is formed in the fifth step S50. The bending area (BA) is bent based on a bending axis (BX), and the groove (GR) of the insulating layer 130 can extend along a direction parallel to the bending axis (BX) (refer to FIG. 1). By forming the groove (GR) and the stress relaxation layer 140 in bending area (BA), stress applied to the insulating layer 130 within the bending area (BA) decreases, thereby reducing or preventing cracking in the insulating layer 130.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising:
    a flexible substrate including a bending area;
    an insulating layer disposed on the flexible substrate;
    at least one groove in the insulating layer within the bending area;
    a stress relaxation layer disposed on the at least one groove; and
    a plurality of wires disposed on the insulating layer and the stress relaxation layer,
    wherein the insulating layer includes a plurality of inorganic layers stacked on the flexible substrate, and the at least one groove of the insulating layer is located in at least one inorganic layer including topmost inorganic layer of the inorganic layers.

2. The flexible display of claim 1, wherein: the flexible substrate includes a display area, and the bending area is located outside of the display area.

3. The flexible display of claim 2, further comprising: a display unit located in the display area, wherein the of plurality of wires are electrically connected to the display unit.

4. The flexible display of claim 3, wherein the stress relaxation layer contacts the flexible substrate.

5. The flexible display of claim 1, wherein: the bending area is bent based with respect to a bending axis, and the at least one groove of the insulating layer extends along a direction parallel to the bending axis.

6. The flexible display of claim 5, wherein: the at least one groove of the insulating layer comprises a plurality of grooves, and the plurality of grooves are spaced apart from each other along a length direction of the wires.

7. The flexible display of claim 1, wherein a top surface of the stress relaxation layer and a top surface of the insulating layer are positioned at substantially the same height from a surface of the flexible substrate.

8. The flexible display of claim 1, wherein the inorganic layers includes at least two of: a barrier layer, a buffer layer, a gate insulating layer, and an interlayer insulating layer.

9. The flexible display of claim 1, wherein the wires are covered by an organic layer.

10. The flexible display of claim 1, wherein the stress relaxation layer includes an organic insulation material.

11. A flexible display, comprising:
    a flexible substrate including a display area and a bending area located outside of the display area;
    a display unit located in the display area;
    an inorganic insulating layer disposed on the flexible substrate;
    a groove in the inorganic insulating layer within the bending area;
    an organic insulating layer disposed on the groove; and
    a plurality of wires electrically connected to the display unit,
    wherein each of the wires includes a first portion disposed on a top surface of the inorganic insulating layer and a second portion disposed on a top surface of the organic insulating layer.

12. The flexible display of claim 11, wherein the first portion and the second portion of each of the wires are located at substantially the same height from a surface of the flexible substrate.

13. The flexible display of claim 12, wherein: the bending area is bent based with respect to a bending axis, and the groove of the inorganic insulating layer extends along a direction parallel to the bending axis.

14. The flexible display of claim 12, wherein the organic insulating layer contacts the flexible substrate.

15. The flexible display of claim 11, wherein: the inorganic insulating layer includes a barrier layer, a buffer layer, a gate insulating layer, and an interlayer insulating layer that are sequentially stacked over the flexible substrate, and the groove of the inorganic insulating layer is located in at least one of the barrier layer, the buffer layer, the gate insulating layer, and the interlayer insulating layer.

16. A method of manufacturing a flexible display, comprising:
    forming an insulating layer in a display area and a non-display area of a flexible substrate;
    forming a groove in the insulating layer within the non-display area;
    forming a stress relaxation layer via filling an organic insulation material into the groove;
    forming a plurality of wires over the insulating layer and the stress relaxation layer within the non-display area; and
    forming a bending area by bending at least a portion of the non-display area.

17. The method of claim 16, wherein: the bending area is bent based with respect to a bending axis, and the groove of the insulating layer extends along a direction parallel to the bending axis.

18. The method of claim 16, wherein a top surface of the stress relaxation layer and a top surface of the insulating layer are located at substantially the same height from a surface of the flexible substrate.

19. The method of claim 16, wherein; the insulating layer includes a plurality of inorganic layers stacked on the flexible substrate, and the groove of the insulating layer is formed in at least one inorganic layer including the topmost inorganic layer of the inorganic layers.

* * * * *